United States Patent [19]

Murphy

[11] 4,121,183

[45] Oct. 17, 1978

[54] PROGRAMMABLE ATTENUATOR APPARATUS EMPLOYING ACTIVE FET SWITCHING

[75] Inventor: Desmond Lewis Murphy, Beaverton, Oreg.

[73] Assignee: Tektronix, Inc., Beaverton, Oreg.

[21] Appl. No.: 736,929

[22] Filed: Oct. 29, 1976

[51] Int. Cl.² .............................................. H03H 7/26
[52] U.S. Cl. .................................. 333/81 R; 307/237; 330/145; 330/284
[58] Field of Search ............. 333/81 R; 307/251, 264, 307/237; 323/80, 74; 330/145, 284; 328/171

[56] References Cited

U.S. PATENT DOCUMENTS

| | | | |
|---|---|---|---|
| 3,796,945 | 3/1974 | Feldman et al. | 323/80 X |
| 3,898,593 | 8/1975 | Qureshi | 333/81 R |
| 3,936,607 | 2/1976 | Gordon | 323/74 X |
| 4,009,400 | 2/1977 | Harris et al. | 307/251 X |
| 4,014,238 | 3/1977 | Southard | 323/80 X |

OTHER PUBLICATIONS

Percision Programmable Attenuator, Rathai et al., News From Rhode & Schwarz, vol. 12, 1972.

Primary Examiner—Paul L. Gensler
Attorney, Agent, or Firm—George T. Noe

[57] ABSTRACT

A high-impedance programmable attenuator utilizing field-effect transistor (FET) switching in both the high-impedance and low-impedance sections. In the high-impedance section, hybrid passive attenuator elements are employed to provide attenuation of electrical signals, and both series and shunt forms of active switching are employed to align the appropriate signal paths. The low-impedance amplifier section includes a FET-switched resistive network.

6 Claims, 1 Drawing Figure

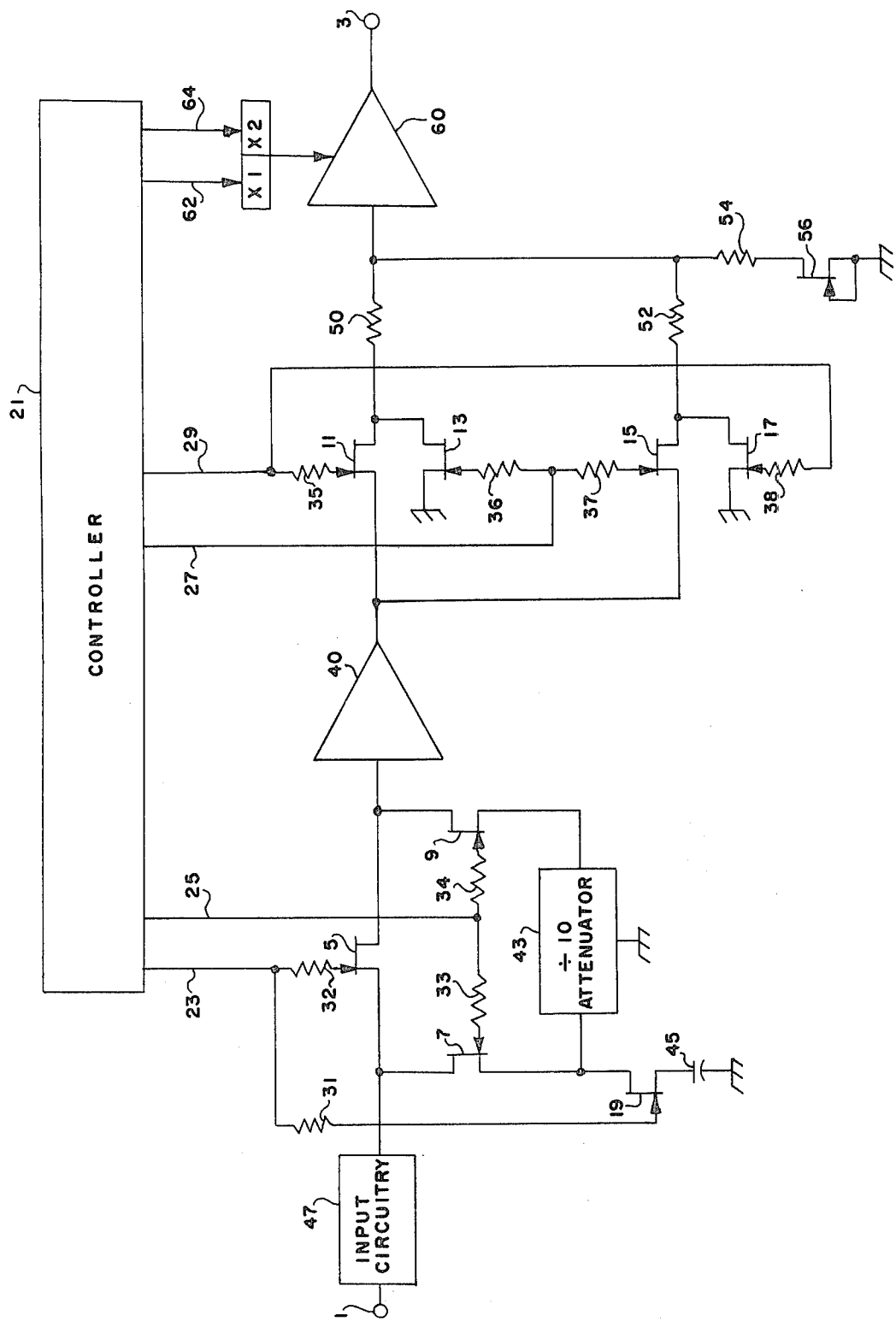

PROGRAMMABLE ATTENUATOR APPARATUS EMPLOYING ACTIVE FET SWITCHING

BACKGROUND OF THE INVENTION

The subject matter of the present invention relates generally to electrical attenuators and switching therefor, and in particular to a programmable step attenuator apparatus.

Previous high-impedance programmable attenuators have been of the rotary or turret type and have utilized electro-mechanical switching means. Such attenuators are relatively expensive, and suffer from the problems of low reliability and relatively low performance. One attempt to overcome the problem of low performance associated with turret-tupe attenuators is the apparatus disclosed in U.S. Pat. No. 3,753,170, wherein hybrid passive attenuator elements are mounted on a circuit board and the switching is accomplished therebetween by means of camactuated circuit-board-mounted contacts. However, such an attenuator does not lend itself to programmability, and further the contacts are susceptible to the same problems incurred in turret-type attenuators, that is, pitting, wear, uneven surface contact, oxidation, and dirt. While designed for extremely high frequency operation, the foregoing undesirable conditions have a detrimental effect on such performance.

SUMMARY OF THE INVENTION

In accordance with the present invention, a high-impedance step attenuator utilizes FET switching to both facilitate programming and overcome the problems incurred with electro-mechanical switch contacts. The attenuator apparatus of the present invention includes both high-impedance and low-impedance sections mounted on a circuit board, and includes hybrid passive attenuator elements to provide attenuation of electrical signals. The channel resistance of the FET devices is incorporated into the design of the circuit. Additional active FET switches and passive networks are provided in the high-impedance attenuator section to compensate parasitic capacitances. The low-impedance amplifier section includes a FET-switched voltage divider network to form a low-impedance attenuator system.

It is therefore one object of the present invention to provide a programmable attenuator apparatus employing active FET switching.

It is another object to provide an attenuator having increased reliability and increased life time of operation.

It is a further object to provide an improved step attenuator apparatus of simple, compact, and inexpensive construction which is capable of being programmed and has an extremely wide frequency response.

It is an additional object to provide an improved attenuator circuit of extremely high frequency response employing active FET switching in both the high-impedance and low-impedance attenuator sections.

Other objects and advantages of the present invention will be apparent from the following detailed description of a preferred embodiment thereof when taken in conjunction with the drawing.

BRIEF DESCRIPTION OF DRAWING

The single FIGURE is a schematic diagram of the preferred embodiment according to the present invention.

DETAILED DESCRIPTION OF THE PREFERRED EMBODIMENT

The attenuator apparatus of the present invention provides attenuation values in a 1-2-5 step sequence between an input terminal 1 and an output terminal 3 to divide down various input signals to levels usable by subsequent processing circuits. Such attenuator apparatus includes a high-impedance input section to minimize loading of a signal source connected to input terminal 1, and a low-impedance output section for connection via terminal 3 to the aforementioned subsequent processing circuits, which, for example, may be a vertical amplifier channel of an oscilloscope. The attenuator apparatus comprises circuit board mounted components, and thus a compact, lightweight unit is provided. The input impedance may typically be one or ten megohms, while the output impedance may be in the order of a few hundred ohms.

Field-effect transistors (FETs) are utilized throughout the attenuator for switching the appropriate divider ratios into the circuit. The high-impedance section includes FET switches 5, 7, and 9, and the low-impedance section includes FET switches 11, 13, 15, and 17. An additional FET switch 19 may be provided in the high-impedance section to reduce the effects of parasitic capacitance as will be explained later. The FETs utilized have a channel resistance in the order of a few ohms, which value is taken into account in choosing attenuator component values.

A controller 21 is connected to the FET switches 5-19 via control lines 23, 25, 27, and 29 and resistors 31-38 to provide switching control biasing voltages to the gates of the FETs. Such controller 21 may suitably be any device which is capable of providing programmable control of attenuator switching, such as a microprocessor or the like. Alternatively, a cam-actuated switch such as shown in U.S. Pat. No. 3,562,464 may be utilized to establish the control voltages on lines 23-29.

In the embodiment shown, the high-impedance attenuator section provides 1:1 and 10:1 attenuation ratios, and it can be discerned that to provide the selection, the voltage on control lines 23 and 25 are complementary so that when FET 5 is turned on, FETs 7 and 9 are turned off, and vice versa. When activated, FET 5 provides a direct coupling of the input signal to a buffer amplifier 40. The 10:1 attenuation ratio is provided by a hybrid attenuator device 43 which is switched into the circuit path by activation of FETs 7 and 9. The hybrid attenuator device is of the type taught in U.S. Pat. No. 3,753,170, and includes passive resistive and capacitive elements to provide proper division of the input signal. Such hybrid attenuator devices may be constructed to provide any desired attenuation value, and therefore are not limited to the 10:1 ratio utilized in this circuit.

When FET 7 is turned off, the inherent capacitance thereacross may cause slight aberrations in the signals at the source of FET 5. This effect may be reduced by an additional FET switch 19 which switches a capacitor 45 into the circuit when FET 5 is on and FET 7 is off.

The high-impedance input section may also include input circuitry 47, which typically consists of passive components to permit precise adjustment of the input impedance to a predetermined value and to provide a selection of input coupling. These input networks are conventional and are well known to those having ordinary skill in the art. Such input circuitry 47 may further include additional attenuator elements or preconditioning circuits to protect the semiconductor devices of the present attenuator apparatus from damage. For example, if high voltage amplitudes are anticipated, reed switches or the like may be utilized at the input of a first attenuator stage.

The high-impedance and low-impedance attenuator sections are isolated by a buffer amplifier 40 interposed therebetween. The buffer amplifier 40 may include a conventional FET source follower or a bipolar transistor emitter follower.

The low-impedance attenuator section includes a switched resistive voltage divider network comprising resistors 50, 52, and 54 which are utilized in conjunction with the channel resistances of the FETs. When FETs 11 and 17 are activated, FETs 13 and 15 are turned off, and the series resistance path includes the channel resistance of FET 11 and resistor 50 while the shunt path to ground includes parallel combination of resistors 52 and 54 and the channel resistances of FETs 17 and 56. On the other hand, when FETs 13 and 15 are activated, FETs 11 and 17 are turned off, and the series resistive path is provided by the channel resistance of FET 15 and resistor 52 while the shunt resistance path is provided by the parallel combination of resistors 50 and 54 and FETs 13 and 56. FET 56 provides thermal compensation for FETs 13 and 17. Assuming that the channel resistance of the FET devices is extremely low in the conducting date resistors 50, 52, and 54 may be assigned resistance values of about 200 ohms, 500 ohms, and 333 ohms respectively to provide attenuation ratios of 2:1 and 5:1 respectively. Therefore, when FETs 11 and 17 are activated, the signal from buffer amplifier 40 is divided down by a ratio of two to one. When FETs 13 and 15 are activated, the signal is divided down by a ratio of five to one. This type of attenuator is referred to as a spoke attenuator, which is fully described in co-pending U.S. patent application Ser. No. 737,123, filed Oct. 29, 1976.

From the foregoing description, it can be seen that the embodiment shown provides attenuation ratios of 2:1, 5:1, 20:1, and 50:1. To obtain attenuation ratios of 1:1 and 10:1, the signals which are divided by factors of 2 and 20 respectively are amplified by a factor of 2. This is achieved by a gain switched amplifier 60, which may be a conventional operational amplifier or the like. Gain factors of 1 and 2 may be selected by switching appropriate resistors under the control of signals on lines 62 and 64 from controller 21.

It will be obvious to those having ordinary skill in the art that many changes may be made in the details of the hereinabove described preferred embodiment of the present invention. Therefore, the scope of the present invention should only be determined by the following claims.

I claim:

1. An attenuator apparatus, comprising:
   an input terminal and an output terminal;
   a high-impedance attenuator section and a low-impedance attenuator section serially disposed between said input terminal and said output terminal, said attenuator sections including impedance means;
   a buffer amplifier interposed between said high-impedance attenuator section and said low-impedance attenuator section; and
   programmable switch means including a plurality of field-effect transistors for selecting said impedance means to provide selectable attenuator networks having predetermined attenuation values;
   said high-impedance attenuator section including a hybrid attenuator device having a predetermined attenuation value serially disposed between a pair of field-effect transistors, said high-impedance attenuator section further including a bypass field-effect transistor in parallel with the serial combination of said hybrid attenuator device and said pair of field-effect transistors, said field-effect transistors being adapted to be selectively switched on and off to provide a selectable signal path therethrough.

2. An attenuator apparatus in accordance with claim 1 wherein said low-impedance attenuator section includes first resistor means and second resistor means each having one end thereof connected to said output terminal, the opposite ends of which are adapted to be selectively connected to the output of said buffer amplifier and to ground through said switch means, so that a voltage divider is formed wherein one of said resistor means is in series with a signal path between said buffer amplifier and said output terminal, and the other resistor means is in shunt with said signal path.

3. An attenuator apparatus in accordance with claim 2 wherein said first and second resistor means are of different resistance values so that two attenuation ratios are provided thereby.

4. An attenuator apparatus in accordance with claim 2 wherein said low-impedance attenuator section further includes third resistor means coupled between said output terminal and ground to provide predetermined voltage divider ratios.

5. An attenuator apparatus in accordance with claim 4 wherein said low-impedance attenuator section further includes a field-effect transistor in series with said third resistor means to provide temperature compensation for said switch means.

6. An attenuator apparatus in accordance with claim 1 further including programming means for providing switch control signals in accordance with predetermined attenuation ratios.

* * * * *